(12) United States Patent
Burr et al.

(10) Patent No.: US 7,388,273 B2
(45) Date of Patent: Jun. 17, 2008

(54) REPROGRAMMABLE FUSE STRUCTURE AND METHOD

(75) Inventors: Geoffrey W. Burr, Cupertino, CA (US); Chandrasekharan Kothandaraman, Hopewell Junction, NY (US); Chung Hon Lam, Peekskill, NY (US); Xiao Hu Liu, Briarcliff Manor, NY (US); Stephen M. Rossnagel, Pleasantville, NY (US); Christy S. Tyberg, Mahopac, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/152,750

(22) Filed: Jun. 14, 2005

(65) Prior Publication Data

US 2006/0278895 A1    Dec. 14, 2006

(51) Int. Cl.
*H01L 29/00*     (2006.01)
(52) U.S. Cl. ............... 257/529; 257/530; 257/E23.149; 257/E21.592
(58) Field of Classification Search ............... 257/529, 257/530, E23.149, E21.592
See application file for complete search history.

(56) References Cited

U.S. PATENT DOCUMENTS

| | | | |
|---|---|---|---|
| 6,456,524 B1 * | 9/2002 | Perner et al. ............... 365/158 |
| 6,522,594 B1 * | 2/2003 | Scheuerlein ............... 365/206 |
| 6,631,085 B2 * | 10/2003 | Kleveland et al. ........... 365/175 |
| 6,643,159 B2 * | 11/2003 | Fricke et al. ................. 365/51 |
| 6,767,816 B2 * | 7/2004 | Kleveland et al. .......... 438/600 |
| 6,768,685 B1 * | 7/2004 | Scheuerlein ........... 365/189.07 |
| 6,781,858 B2 * | 8/2004 | Fricke et al. ................. 365/51 |
| 6,784,517 B2 * | 8/2004 | Kleveland et al. ........... 257/530 |
| 6,879,525 B2 * | 4/2005 | Van Brocklin et al. . 365/189.09 |
| 7,002,825 B2 * | 2/2006 | Scheuerlein ................. 365/51 |
| 7,142,471 B2 * | 11/2006 | Fasoli et al. ................ 365/200 |
| 7,177,181 B1 * | 2/2007 | Scheuerlein ................ 365/175 |
| 7,177,183 B2 * | 2/2007 | Scheuerlein et al. ... 365/185.02 |
| 2003/0031067 A1 * | 2/2003 | Kleveland et al. .......... 365/200 |
| 2003/0053332 A1 * | 3/2003 | Kleveland et al. ..... 365/185.03 |
| 2003/0062595 A1 * | 4/2003 | Anthony ..................... 257/530 |
| 2003/0081445 A1 * | 5/2003 | Van Brocklin et al. ..... 365/100 |
| 2003/0185048 A1 * | 10/2003 | Fricke et al. ............... 365/170 |
| 2003/0214841 A9 * | 11/2003 | Scheuerlein et al. ... 365/185.03 |
| 2004/0042313 A1 * | 3/2004 | Fricke et al. ............... 365/222 |
| 2004/0140523 A1 * | 7/2004 | Hudgens et al. ............ 257/528 |

(Continued)

*Primary Examiner*—Ngan Ngo
(74) *Attorney, Agent, or Firm*—Ohlandt, Greeley, Ruggiero & Perle L.L.P.; Daniel P. Morris, Esq.

(57) ABSTRACT

A reversible fuse structure in an integrated circuit is obtained through the implementation of a fuse cell having a short thin line of phase change materials in contact with via and line structures capable of passing current through the line of phase change material (fuse cell). The current is passed through the fuse cell in order to change the material from a less resistive material to a more resistive material through heating the phase change material in the crystalline state to the melting point then quickly quenching the material into the amorphous state. The reversible programming is achieved by passing a lower current through the fuse cell to convert the high resistivity amorphous material to a lower resistivity crystalline material. Appropriate sense-circuitry is integrated to read the information stored in the fuses, wherein said sense circuitry is used to enable or disable circuitry.

12 Claims, 4 Drawing Sheets

U.S. PATENT DOCUMENTS

| | | | |
|---|---|---|---|
| 2004/0179398 A1* | 9/2004 | Kleveland et al. | 365/185.03 |
| 2004/0190360 A1* | 9/2004 | Scheuerlein | 365/225.7 |
| 2004/0262635 A1* | 12/2004 | Lee | 257/199 |
| 2005/0180244 A1* | 8/2005 | Scheuerlein | 265/225.7 |
| 2006/0183052 A1* | 8/2006 | Deguchi et al. | 430/270.11 |
| 2006/0221702 A1* | 10/2006 | Scheuerlein et al. | 365/185.23 |
| 2006/0221728 A1* | 10/2006 | Fasoli et al. | 365/200 |
| 2006/0221752 A1* | 10/2006 | Fasoli et al. | 365/230.03 |
| 2006/0275962 A1* | 12/2006 | Lee | 438/152 |

* cited by examiner

REPROGRAMMABLE FUSE STRUCTURE AND METHOD

BACKGROUND OF THE INVENTION

1. Field of the Invention

The present invention relates generally to the field of integrated circuits. More particularly, the present invention relates to reversible fusible link programming through utilization of phase change materials in semiconductor integrated circuits.

2. Description of the Related Art

Redundancy in integrated circuit memories is part of the current chip manufacturing strategy to improve yield. By replacing defective cells with duplicate or redundant circuits on chips, integrated circuit memory yields are significantly increased. The current practice is to blow conductive connections (fuses), thereby allowing the redundant memory cells to be used in place of non functional cells. It is also common practice to provide for customization of chips and modules to adapt chips to specific applications. By selectively blowing fuses within an integrated circuit having multiple potential uses, a single integrated circuit design may be economically manufactured and adapted to a variety of custom uses.

Current E-Fuse Technology is capable of providing hierarchal repair of the chip at multiple levels; a first repair at first pass wafer final test (WFT), a second repair at $2^{nd}$ pass WFT, and a third repair during the final test of the packaged chip. To implement this hierarchal repair, either the fuses are programmed at each stage of repair, or the data is saved as strings for each level until the final level where all fuses are programmed. With the first method where the fuses are programmed at each stage of repair extra redundancy must be built in to allow this repair in three steps. This is sometimes inefficient and leads to duplicate repairs at multiple levels requiring extra redundancy. The other option, where all the fuses are programmed at once at the final test level, has the advantage of preventing unnecessary programming of fuses in level one that would require repair at a higher level, thus reducing the amount of redundancy required to achieve the same repair. However, this repair can be done only once and must incorporate all the repair data from the different levels of test, preventing any repair or tailoring at the customer or end user site.

In addition, programming currents of about 10 mA and voltages of 3.3 to 3.5 V are required. This order of current requires a wide programming transistor, consuming significant silicon area. If this current can be reduced there could be significant savings in silicon area.

Reprogrammable Fuses utilizing chalcogenide materials and indirect heating through a resistive heater are described in U.S. Pat. No. 6,448,576 B1 entitled Programmable Chalcogenide Fuse Within A Semiconductor Device of John D. Davis et al. which is assigned to BAE Systems Information and Electronic Systems Integration, Inc., the contents of which are incorporated herein by reference in their entirety.

SUMMARY OF THE INVENTION

The present invention achieves technical advantages as a system, apparatus, structure and method by enabling a reversibly programmable fuse structure.

It is an object of the present invention to provide a reprogrammable (reversibly programmable) fuse structure, utilizing a phase change material, with associated control circuitry to change the state of the fuse cell from the higher resistivity state to the lower resistivity state or from the lower resistivity state to the higher resistivity state; and appropriate sense-circuitry similarly integrated to read the information stored in the fuses, where said sense circuitry is used to enable or disable circuitry. The fuse cell is comprised of phase change material in a line configuration which includes a cathode and an anode coupled by a fuse link having an electrically more conductive phase and an electrically less conductive phase, coupled to a power supply. A current is passed through the conductive fuse link via the cathode and anode in which the current and material resistivity are sufficient to heat the fuse link and induce phase transformation changing the conductivity of the system. The fuse, which is initially in a more conductive state, can be heated above the melting point of the phase change material in the fuse link to convert the fuse link to a less conductive state. The fuse can then be converted back to a more conductive state by passing sufficient current through the fuse link to induce crystallization of the material making up the fuse link.

This reprogrammable fuse structure provides advantage over the prior-art reprogrammable chalcogenide fuse structure in several aspects. The proposed structure enables lower applied currents and voltages required to change the state of the fuse through utilization of direct heating and minimization of the cross-sectional area of the fuse. In addition, the proposed structure and method of the preferred embodiment minimizes additional processing steps and allows easy implementation in a Copper plus low k dielectric back end of the line (BEOL) interconnect structure.

The method of the preferred embodiment uses only existing dual damascene BEOL processes and adds only one additional mask step to define the fuse cell. Modeling of indirect heating vs. direct heating indicates that indirect heating is not feasible for the majority if not all phase change fuse cells at current or future manufacturable dimensions. Phase change materials that have the desired resistivities and thermal stabilities to function in a fuse cell have very low thermal conductivities which prevent the necessary heat transfer from an external heating element such as described in U.S. Pat. No. 6,448,576 B1.

Modeling of an ideal structure with a very small fuse line cell (thickness of less than 30 nm width of about 80 nm, with the resistive heating surrounding 3 sides of the cell) predicts that very high temperatures (about 2000° C.) would be required within the resistive heater in order to convert a standard $Ge_2Sb_2Te_5$ chalcogenide material from the low resistivity (crystalline) state to the high resistivity (amorphous) state. Thicker fuse line cells, such as that proposed in the prior art (500 nm in thickness) would not be possible to convert through an external resistive heater.

Based on the ideal small fuse cell dimensions and materials used in the modeling of heating through a resistive heater; high currents greater than 15 mA would be required to generate these high temperatures. Similar modeling of the inventive fuse cell indicates that significantly lower currents (<3 mA) would be required to change the phase of the material, and much more reasonable temperatures (maximum temperature<1000° C.) are generated in the structure. The temperature is also well isolated within the fuse cell preventing surrounding structures from being exposed to very high temperatures.

It is an object of this invention to provide a reprogrammable fuse structure within a low-k dielectric plus Cu interconnect structure of a single or dual damascene type.

It is another object of this invention to provide a reprogrammable fuse structure within a fuse bank, where the reprogrammable fuses are located in a low k dielectric plus Cu interconnect structure of a single or dual damascene type.

It is still another object of this invention to provide a reprogrammable fuse structure requiring significantly lower programming currents compared with the prior art fuses.

It is yet another object of this invention to provide a method of making the present inventive structure.

DESCRIPTION OF THE PREFERRED EMBODIMENTS

A Structure According to the Present Invention

Figure 1:
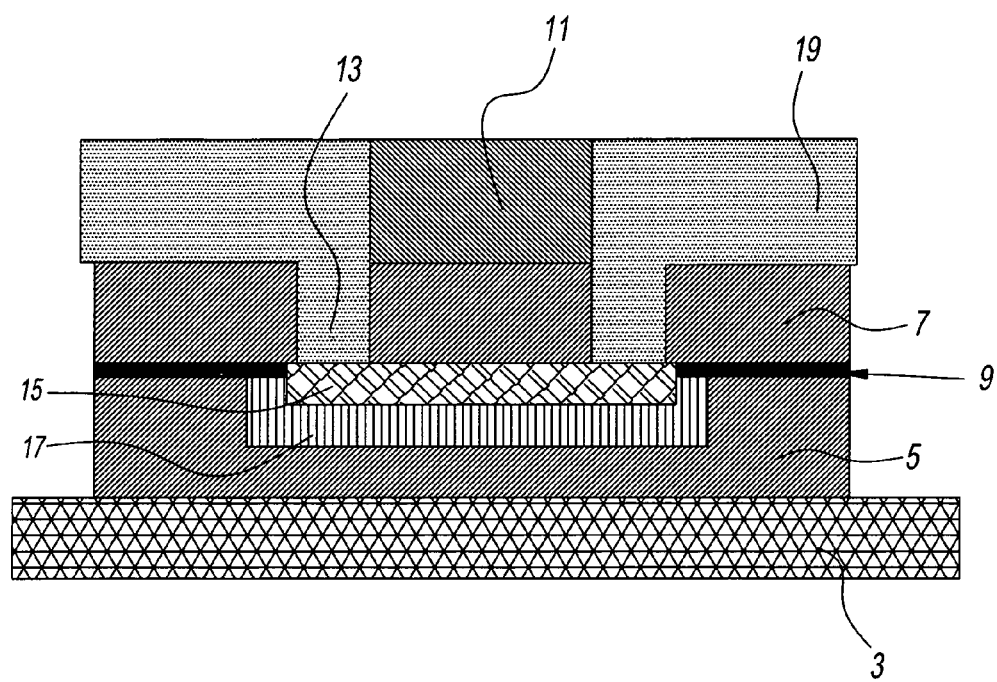
FIG. 1 is a schematic drawing illustrating a cross-sectional view of the fuse structure in the first embodiment.

Referring to FIG. 1, a reprogrammable fuse structure within an electrical interconnect structure, has substrate 3, a line level dielectric layer 5, a short line of phase change material 15 forming the fuse cell within the line level dielectric layer extending partially through the thickness of the line level dielectric layer, a thin capping dielectric layer atop said line level dielectric layer 9, a via level dielectric layer 7 containing two via's 13 which are in contact with the surface of the phase change material in the first line level dielectric layer forming the anode and cathode of the fuse cell, and a second line level dielectric layer 11 atop said via level dielectric layer containing lines 19 in contact with the via's in the via level dielectric layer. This reprogrammable fuse structure has associated control circuitry to change the state of the phase change material from the higher resistivity state to the lower resistivity state or from the lower resistivity state to the higher resistivity state; and appropriate sense-circuitry similarly integrated to read the information stored in the fuses, where said sense circuitry is used to enable or disable circuitry.

The first line level dielectric layer 5, via level dielectric layer 7, and second line level dielectric layer 11 can be the same or different materials and can be comprised of oxide, a low k dielectric material, or a porous low k dielectric material.

The phase change material 15 can be comprised of doped or undoped $Ge_xSb_yTe_z$ materials, doped or undoped $Ge_xSb_y$ materials, doped or undoped $SbxTe_y$ materials, or any other material that undergoes a reversible phase change which gives a change in conductivity of the material at a temperature that can be controlled in the fuse structure.

The phase change material should not undergo crystallization over a period of 10 years at temperatures below 90° C. and more preferably at temperatures below 120° C.

The line of phase change material has a length of about 50 nm to about 1000 nm and preferably a length of between 100 and 300 nm, a width of about 10 nm to about 100 nm, preferably about 20 nm to about 50 nm and a depth of about 5 nm to about 200 nm, preferably about 10 to about 40 nm.

As mentioned herein above, crystallization should not occur below 120° C., and melting should occur below about 1000° C., preferably below 700° C. Higher crystallization temperatures are preferred in order to ensure long-term stability of the state of the fuse cell. Materials with higher crystallization temperatures can be implemented in the fuse cell to improve long term stability because the programming time is not critical. This is different from a phase change memory cell which requires very fast switching times. The line and via contacts to the phase change material provide a path for current to pass through the phase change material in order to program the fuse. A lower current than the programming current can be passed through the material to detect the level of resistivity of the fuse cell. Programming is achieved through resistive heating of the cell which will convert the material from crystalline (lower resistivity) to amorphous (higher resistivity) and amorphous to crystalline.

The structure can have a dielectric layer 17 surrounding the line of phase change material 15. This dielectric layer can be designed to have low thermal conductivity and thermal stability sufficient to show no significant thermal degradation after exposure to the temperature and time required for phase transformation of the phase change material.

The phase change line (fuse cell) can have a length of about 50 nm to about 1000 nm and preferably a length of between 100 and 300 nm. The phase change line (fuse cell) can have a width of about 10 nm to about 100 nm, preferably about 20 nm to about 50 nm. The phase change line (fuse cell) can have a depth of about 5 nm to about 200 nm, preferably about 10 to about 40 nm. Scaling the phase change line to smaller cross-sectional area will allow scaling of the current required to achieve phase change of the material. The fuse cell dimensions, the phase change material resistivities, and the surrounding dielectric materials are chosen to enable complete phase change of a cross-section of the fuse cell at voltages at or below about 2 V and currents at or below 5 mA, preferably below 1 mA, and more preferably at or below about 0.5 mA.

These low current and voltage requirements provide significant advantage over prior art fuse structures that require more than 3 V and about 10 mA current. The low currents required to program the inventive structure enable very significant reduction in the area consumed by the programming transistor for the fuse cell compared with prior art fuse structures. Prior art fuse structures of this type are described in U.S. Pat. No. 6,624,499 B2 entitled System For Programming Fuse Structure by Electromigration of Silicide Enhanced by Creating Temperature Gradient of Chandrasekharan Kothandaraman et al. which is assigned to Infineon Technologies AG and The International Business Machines Corporation, the contents of which is incorporated herein in it's entirety by reference.

The structure can have a plurality of patterned metal conductors formed within the dielectric layers 5, 7, and 11 on the substrate. At least one of the patterned metal conductors can be an electrical line and in the case of a dual damascene structure at least one of the patterned metal conductors can be a via.

The structure can have a programmable fuse-bank, such as the one described in U.S. Pat. No. 6,624,499 B2 entitled System For Programming Fuse Structure by Electromigration of Silicide Enhanced by Creating Temperature Gradient of Chandrasekharan Kothandaraman et al. which is assigned to Infineon Technologies AG and The International Business Machines Corporation, the contents of which is incorporated herein in it's entirety by reference, where some or all of the fuses within the fuse bank have a fuse cell that can be reversibly programmed.

Figure 2:
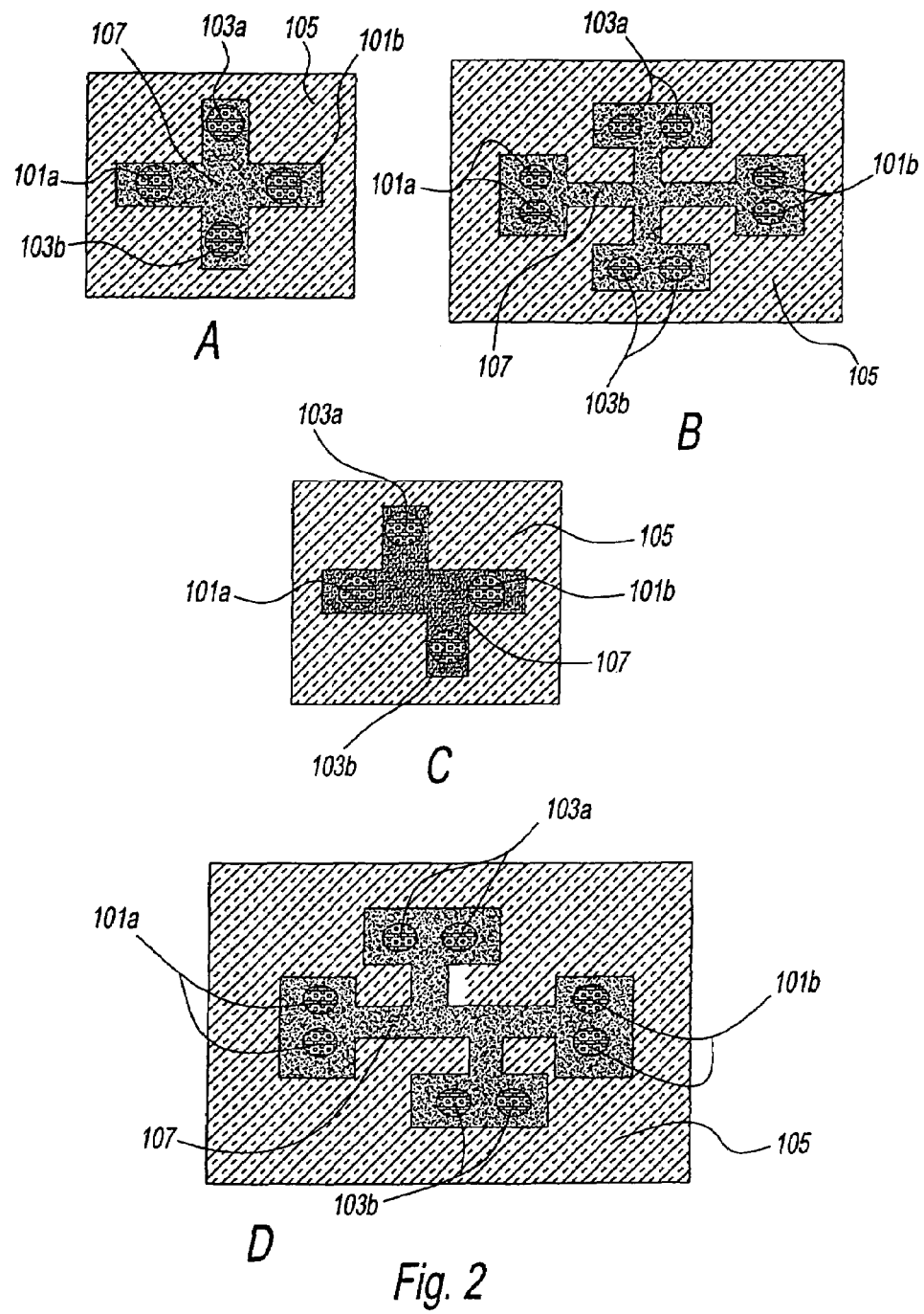
FIG. 2a is a schematic drawing illustrating a top view of the fuse structure in the second embodiment having a cross structure of phase change material with one set of via contacts for programming the fuse and another set of via contacts for sensing the state of the fuse.
FIG. 2b is a schematic drawing illustrating a top view of the fuse structure in the second embodiment having a cross structure of phase change material with multiple via contacts to improve manufacturability and reliability.
FIG. 2c is a schematic drawing illustrating a top view of the fuse structure in the second embodiment having a staggered cross structure of phase change material with one set of via contacts for programming the fuse and another set of via contacts for sensing the state of the fuse.
FIG. 2d is a schematic drawing illustrating a top view of the fuse structure in the second embodiment having a staggered cross structure of phase change material with multiple via contacts in order to improve manufacturability and reliability.

Referring to FIGS. 2a and 2c, in another embodiment of the invention the reprogrammable fuse structure can have a cross or staggered cross structure of phase change material 107, embedded in a dielectric material 105, with one set of via contacts for programming the fuse 101a and 101b with associated control circuitry to change the state of the fuse cell from the higher resistivity state to the lower resistivity state or from the lower resistivity state to the higher resistivity state, and another set of via contacts for sensing the state of the fuse 103a and 103b with appropriate sense-circuitry to read the information stored in the fuses, where said sense circuitry is used to enable or disable circuitry. Each line of the cross should have dimensions preferably similar to those described in the first embodiment of the invention.

The structure may also have other configurations. For example, in one configuration, the phase change material has a center region and four ends and four vias, wherein each via contacts the phase change material at each end. Two of these vias at any two ends, which are displaced from the center region, are connected to control circuitry for programming the fuse provided that the two ends are connected through a path that crosses the center point. The other two vias at the two remaining ends are also displaced from the center region and are in contact with sense-circuitry for sensing the fuse, provided that the two ends are also connected through a path that crosses the center point.

The structure can have further configurations. For example, in another configuration, the phase change material has a center region and four ends and at least four vias, wherein each via contacts the phase change material at any end. At least two of these vias at any two ends, which are displaced from the center region, are connected to control circuitry for programming the fuse provided that the two ends are connected through a path that crosses the center point. The other remaining vias at any two remaining ends are also displaced from the center region and are in contact with sense-circuitry for sensing the fuse, provided that the two ends are also connected through a path that crosses the center point.

Referring to FIGS. 2b and 2d, the structure can have wider regions at the end of the fuse cell lines with multiple via contacts in order to improve manufacturability and reliability of the structure by ensuring landing of the contacts on the phase change material in a reproducible fashion.

The structure can also have an additional dielectric material lining the phase change material as with the first embodiment. This dielectric provides thermal insulation from a surrounding low-k or porous low-k structure within the electrical interconnect structure.

The advantage of separating the contacts for programming the fuse from the contacts for sensing the state of the fuse is that the sensing and programming operations require significantly different applied voltages.

Phase change materials in the higher resistivity (amorphous) state have a very high resistivity which will prevent any current from passing through the material in this state until the voltage surpasses the breakdown voltage of the structure. Once the breakdown voltage of the cell is surpassed, current will flow and the cell can be heated to change state thereby programming the cell to the lower resistivity (crystalline) state. During sensing of the state of the fuse cell, it is critical that the voltage remains below this breakdown voltage of the cell in the high resistivity state. Separation of the programming contacts and the sensing contacts will prevent damage to the sense circuitry from the higher voltages required for programming.

Figure 3:
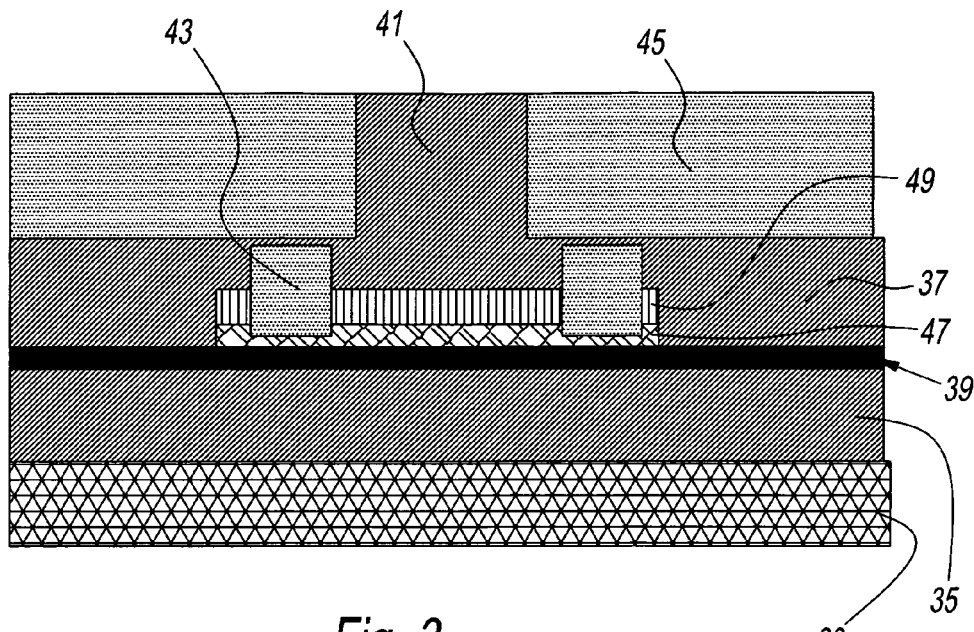
FIG. 3 is a schematic drawing illustrating a cross-sectional view of the fuse structure in the third embodiment.

Referring to FIG. 3, in another embodiment of the invention, the structure has substrate 33, a line level dielectric layer 35, a thin cap dielectric layer 39, a via level dielectric layer 37, a second line level dielectric layer 41, a short line of phase change material 47 within the via level dielectric layer 37 extending from the surface of the cap dielectric 39 partially into the via level dielectric layer 37. The via level dielectric also contains via's 43 in contact with the phase change material 47. The line level dielectric 41 contains lines 45 in contact with the via's 43. The via contacts to the phase change material provide a path for current to pass through the phase change material in order to program the fuse and to detect the level of resistivity of the fuse cell. The structure can also include an additional dielectric layer 49 atop the phase change material 47. This dielectric layer 49 can be designed to have low thermal conductivity and thermal stability sufficient to show no significant thermal degradation after exposure to the temperature and time required for phase transformation of the phase change material. The first line level dielectric layer 35, via level dielectric layer 37, and second line level dielectric layer 41 can be the same or different materials and can be comprised of oxide, a low k dielectric material, or a porous low k dielectric material.

The structure can have a plurality of patterned metal conductors formed within the dielectric layers 35, 37, and 41 on the substrate. At least one of the patterned metal conductors can be an electrical line and in the case of a dual damascene structure at least one of the patterned metal conductors can be a via.

Figure 4:
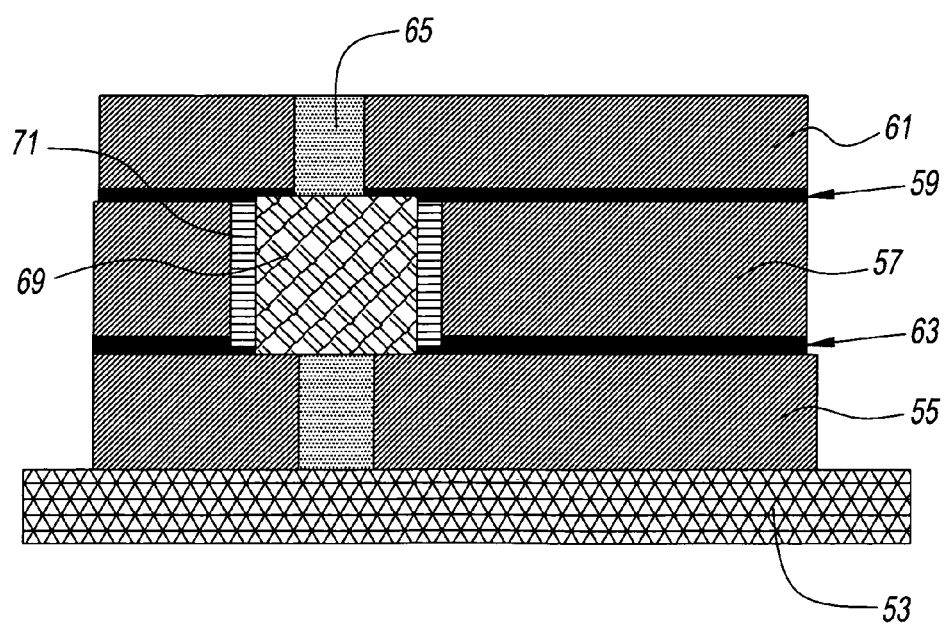
FIG. 4 is a schematic drawing illustrating a cross-sectional view of the fuse structure in the fourth embodiment.

Referring to FIG. 4, in another embodiment of the invention, the structure can have a substrate 53, a via level dielectric layer 55 containing a via 67, a thin cap dielectric layer 63, a line level dielectric layer 57 containing a section of phase change material 69 in contact with the via 67, a second cap dielectric layer 59, and a second via level dielectric 61 containing a via in contact with the phase change material 69. The structure can also contain an additional dielectric 71 on the sides of the phase change material. This dielectric layer 71 can be designed to have low thermal conductivity and thermal stability sufficient to show no significant thermal degradation after exposure to the temperature and time required for phase transformation of the phase change material. The first via level dielectric layer 55, line level dielectric layer 57, and second via level dielectric layer 61 can be the same or different materials and can be comprised of oxide, a low k dielectric material, or a porous low k dielectric material. The structure can have a plurality of patterned metal conductors formed within the dielectric layers 55, 57, and 61 on the substrate. At least one of the patterned metal conductors can be an electrical line and in the case of a dual damascene structure at least one of the patterned metal conductors can be a via.

Figure 5:
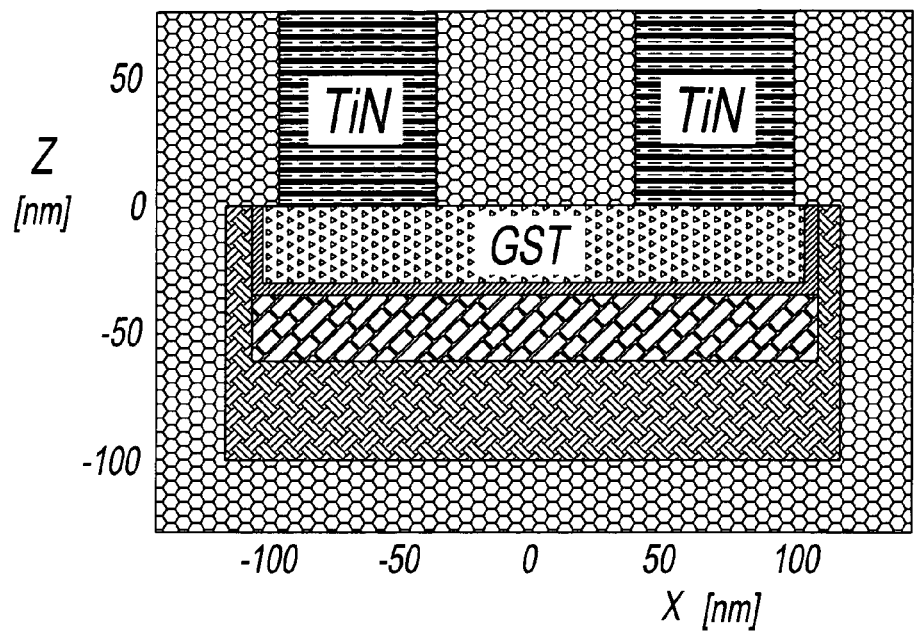
FIG. 5 is a schematic drawing illustrating the structure and dimensions used for modeling the indirect heating method.
Figure 5:
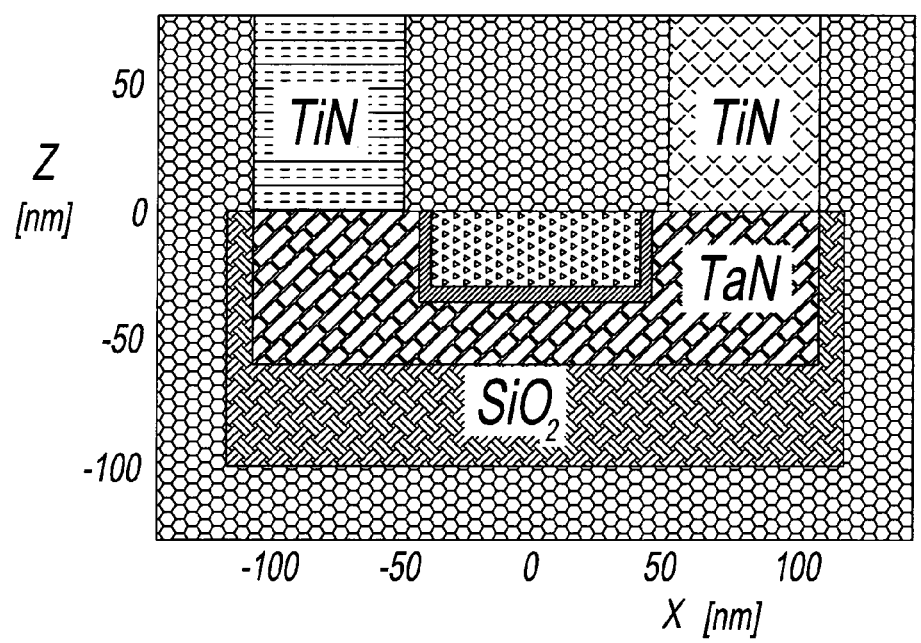

Referring to FIG. 5, modeling of an ideal structure with a very small fuse line cell (thickness of less than 30 nm width of about 80 nm, with the resistive heating surrounding 3 sides of the cell) predicts that very high temperatures (about 2000° C.) would be required within the resistive heater in order to convert a standard Ge2Sb2Te5 chalcogenide material from the low resistivity (crystalline) state to the high resistivity (amorphous) state.

A Method According to the Present Invention

The invention is also directed to a method of forming a reprogrammable fuse structure within a low-k dielectric plus Cu interconnect structure of a single or dual damascene type, including the steps of providing a first dielectric of a single damascene or dual damascene thickness, patterning a shallow trench into the dielectric material extending partially through the thickness of the line level dielectric layer, filling the trench with a phase change material, planarizing the phase change material using CMP, forming a plurality of patterned metal conductors within the dielectric layer, planarizing the plurality of patterned metal conductors within the dielectric layer, and depositing a thin cap layer over the dielectric layer with the plurality of patterned metal conductors and patterned phase change materials. The method further includes the steps of forming a second single or dual damascene level with a plurality of patterned metal conductors containing via's in contact with the phase change material in the prior level. The dielectric layers can be comprised of oxide, low k dielectrics, or porous low k dielectrics. The phase change material can be comprised of doped or undoped $Ge_xSb_yTe_z$ materials, doped or undoped $Ge_xSb_y$ materials, doped or undoped $Sb_xTe_y$ materials, or any other material that undergoes a reversible phase change which gives a change in conductivity of the material at a temperature that can be controlled in the fuse structure. Crystallization should not occur below 120° C., and melting should occur below about 1000° C., preferably below 700° C. The method can further include the step of depositing a conformal dielectric prior to depositing the phase change material. The conformal dielectric can be oxide, a low k dielectric, or a porous low k dielectric with sufficient thermal stability as to not show significant degradation at the times and temperatures required for programming the fuse. The method can further include the step of depositing a thin protective hardmask layer over the dielectric with patterned phase change material. The protective hardmask layer can be comprised of oxide, low k dielectric materials, or any material that will provide resistance to processes included in the generation of the plurality of patterned metal conductors and can be removed by CMP during the final step of formation of the plurality of patterned metal conductors within the dielectric layer.

In another embodiment of the invention, the method can include the steps of depositing a thin film of phase change material on a substrate using lithography, etching to define a short line structure pattern of the phase change material, depositing a planarizing dielectric of a single or dual damascene thickness over the phase change material, and forming a plurality of patterned metal conductors within the dielectric with via's in contact with the phase change material.

This method can further have the step of depositing a thin dielectric material over the phase change material prior to defining the pattern by lithography and etching steps. This dielectric material can have a different composition, dielectric constant, thermal conductivity, or thermal stability compared with the planarizing dielectric layer. This dielectric material can be comprised of oxide, low k dielectric materials, porous low k dielectric materials, or any material with a thermal stability sufficient to withstand the time and temperature pulse generated during programming of the fuse.

The unique structure of the present invention enables reversible switching of fuses with low currents embedded in a Low k plus Cu interconnect structure. In addition, it enables scaling of the current requirements for switching based on tailoring the dimensions of the fuse line cell, the resistivity of the phase change material, or the thermal conductivity of the surrounding materials.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A reprogrammable fuse structure, comprising:
a phase-change material that has a higher resistivity state and a lower resistivity state, having a center point and end regions contacted at a plurality of locations with via contacts, wherein one set of at least two via contacts at two end regions are connected to control circuitry for programming the fuse and a second set of at least two via contacts at two end regions are in contact with sense-circuitry for sensing the fuse; provided that said first set and said second set of at least two via contacts at two end regions are connected through a path that crosses the center point;
control circuitry to change the state of the phase change material from the higher resistivity state to the lower resistivity state or from the lower resistivity state to the higher resistivity state; and
appropriate sense-circuitry similarly integrated to read the information stored in the fuses, wherein said sense circuitry is used to enable or disable circuitry.

2. The reprogrammable fuse structure of claim 1, wherein said via contacts form a cross or staggered cross structure with four end regions.

3. The reprogrammable fuse structure of claim 1, wherein the control circuitry is capable of providing high voltages sufficient to pass current through the fuse structure while in the high resistivity state.

4. The reprogrammable fuse structure of claim 1, wherein the sense circuitry is incapable of providing high voltages sufficient to pass current through the fuse cell while in the high resistivity state.

5. The reprogrammable fuse structure of claim 1, wherein at least a portion of the end regions of phase change material are wider than the center.

6. The reprogrammable fuse structure of claim 5, wherein multiple via contacts are located at each end region.

7. The reprogrammable fuse structure of claim 1, wherein the fuse structure is embedded in a Cu plus low k interconnect structure.

8. The reprogrammable fuse structure of claim 7, further comprising:

a second dielectric surrounding the phase change material which is different in composition from the low k dielectric of the interconnect structure.

9. The reprogrammable fuse structure of claim 8, wherein the second dielectric surrounding the phase change material is designed to be more thermally stable than the first low k dielectric to prevent the low k dielectric from being exposed to the high temperatures generated during programming of the fuse.

10. A reprogrammable fuse structure comprising:
   a first via level dielectric containing a short line of phase change material that has a higher resistivity state and a lower resistivity state, and conducting via's in contact with the phase change material;
   a first line level dielectric, atop the first via level dielectric, with conducting lines in contact with the conducting via's in the first via level dielectric;
   control circuitry to change the state of the phase change material from the higher resistivity state to the lower resistivity state or from the lower resistivity state to the higher resistivity state; and
   appropriate sense-circuitry similarly integrated to read the information stored in the fuses,
   wherein said sense circuitry is used to enable or disable circuitry.

11. The reprogrammable fuse structure of claim 10, further comprising:
   a thin dielectric layer above the phase change material of a different composition than the via level dielectric layer.

12. A reprogrammable fuse structure comprising:
   a first via level dielectric containing a conductive via;
   a first line level dielectric atop said first via level dielectric containing a short line of phase change material that has a higher resistivity state and a lower resistivity state, wherein said phase change material is in contact with said conductive via;
   a second via level dielectric atop said first line level dielectric containing a conductive via in contact with said phase change material;
   control circuitry to change the state of the phase change material from the higher resistivity state to the lower resistivity state or from the lower resistivity state to the higher resistivity state; and
   appropriate sense-circuitry similarly integrated to read the information stored in the fuses,
   wherein said sense circuitry is used to enable or disable circuitry.

* * * * *